United States Patent
Yoshida

(10) Patent No.: US 6,862,311 B2
(45) Date of Patent: Mar. 1, 2005

(54) SEMICONDUCTOR LASER DEVICE

(75) Inventor: Yasuaki Yoshida, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 88 days.

(21) Appl. No.: 10/459,530

(22) Filed: Jun. 12, 2003

(65) Prior Publication Data
US 2004/0151223 A1 Aug. 5, 2004

(30) Foreign Application Priority Data

Jan. 30, 2003 (JP) .................................... 2003-021319

(51) Int. Cl.⁷ .............................................. H01S 5/00
(52) U.S. Cl. ......................................... 372/45; 372/46
(58) Field of Search ................................... 372/43–50

(56) References Cited

U.S. PATENT DOCUMENTS

| 5,301,202 | A | | 4/1994 | Harder et al. ................. 372/46 |
|---|---|---|---|---|
| 5,438,585 | A | * | 8/1995 | Armour et al. ............... 372/45 |
| 6,285,694 | B1 | | 9/2001 | Shigihara .................... 372/45 |
| 6,542,528 | B1 | | 4/2003 | Sato et al. ................... 372/45 |

FOREIGN PATENT DOCUMENTS

| JP | 8-195529 | 7/1996 |
|---|---|---|
| JP | 10-22561 | 1/1998 |
| JP | 2001-15864 | 1/2001 |
| JP | 2002-299768 | 10/2002 |

OTHER PUBLICATIONS

Shigihara, et al.; "High–Power 980–nm Ridge Waveguide Laser Diodes Including an Asymmetrically Expanded Optical Field Normal to the Active Layer", *IEEE J. of Quantum Elec.*, No. 8, pp. 1081–1088 (Aug. 2002).

* cited by examiner

*Primary Examiner*—Quyen Leung
(74) *Attorney, Agent, or Firm*—Leydig, Voit & Mayer, Ltd.

(57) ABSTRACT

A semiconductor laser device includes a lower cladding layer of n-(Al0.66Ga0.34)0.5In0.5P, an active layer having a window structure which has a disordered MQW structure, a first upper cladding layer of p-(Al0.7Ga0.3)0.5In0.5P, and a second upper cladding layer of (Al0.66Ga0.34)0.5In0.5P sequentially disposed on an n-GaAs substrate. The refractive index of the first upper cladding layer is smaller than that of the lower cladding layer, and refractive index of the second upper cladding layer is larger than that of the first upper cladding layer and identical to that of the lower cladding layer. The position of peak light intensity at the window structure of the active layer coincides with or very closely approaches the position of the active layer.

2 Claims, 5 Drawing Sheets

SEMICONDUCTOR LASER DEVICE

BACKGROUND OF THE INVENTION

1. Field of the Invention

The present invention relates to a semiconductor laser device used in an optical disc system, optical communications, etc., and particularly to a semiconductor laser device wherein a refractive index distribution is asymmetrical with respect to an active region.

2. Description of the Related Art

In recent years, a large-capacity and portable writeable optical disc system has become exponentially common as an external memory device or the like for a personal computer. The development of a semiconductor laser device high in optical output efficiency and good in optical characteristics and temperature characteristics is essential to the size reduction and portability of the optical disc system.

One method of increasing slope efficiency of a semiconductor laser and enhancing kink level and temperature characteristics or the like thereof has been proposed. In an n-type (Al$_x$Ga$_{1-x}$)$_y$In$_{1-y}$P cladding layer ("n type" and "p type" conductivity type are hereinafter denoted as "n-" and "p-" respectively) and a p-(Al$_x$Ga$_{1-x}$)$_y$In$_{1-y}$P cladding layer, both employed in a semiconductor laser producing red light using, for example, AlGaInP, composition ratio x of the n-cladding layer and composition ratio x of the p-cladding layer are set to different values. The refractive index of the n-cladding layer is set higher than that of the p-cladding layer, whereby light distribution is biased toward the n-cladding layer side and has reduced light absorption (refer to, K. Shigihara et Al., "High-power 980-nm Ridge Waveguide Laser Diodes Including an Asymmetrically Expanded Optical Field Normal to the Active Layer", IEEE JOURNAL OF QUANTUM ELECTRONICS, Vol. 38, No. 8, AUGUST 2202, pp.1081–1088 (FIG. 6), for example).

In a GaN-based laser producing blue-violet light, it has been disclosed that refractive indices of optical guide layers sandwiching an active layer having a multi-quantum well structure asymmetrical to shift peak position of light intensity distribution to the P side relative to the position of an active layer. The active layer is prevented from deteriorating and the reliability at high optical output is enhanced (refer to Japanese Patent Laid-open No. 2002-299768 (eighth column, FIG. 9), for example).

There has also been disclosed an example in which the thickness and a refractive index distribution of an n-cladding layer on the n-GaAs substrate, and the thickness and a refractive index distribution of a p-cladding layer having a ridge form at part thereof, provided on the opposite side of the n-GaAs substrate with respect to an undoped InGaAs active layer are respectively asymmetrical. According to this configuration, the influence of a refractive index distribution in a width direction of a ridge portion, which is produced due to the difference in refractive index between the ridge portion and an outer side of the ridge portion, upon the light in the waveguide is reduced. The occurrence of high-order modes is prevented, thereby making it possible to prevent the occurrence of a kink at low output so an increase in output can be achieved (refer to Japanese Patent Laid-open No. 11-233883 (FIGS. 1, 2, 4 to 6 and 8), for example corresponding to U.S. Pat. No. 6,285,694).

A example has been disclosed wherein in an AlGaInP semiconductor laser element, an n-Al0.66In0.34P cladding layer 3, an undoped (Al0.15Ga0.85)0.66In0.34P optical guide layer 4, an undoped GaInAsP active layer 5, an undoped (Al0.15Ga0.85)0.66In0.34P optical guide layer 4, an MQW structure 6 (p-Al0.66In0.34PMQW barrier layer, p-(Al0.15Ga0.85)0.66In0.34PMWQ well layer), and a p-Al0.66In0.34P cladding layer 7 are provided, thereby improving device characteristics, such as threshold current and characteristic temperature (refer to Japanese Patent Laid-open No. 2001-24285 (FIG. 4), for example corresponding to U.S. Pat. No. 6,542,528).

An example has been disclosed wherein a semiconductor laser epitaxial crystal laminated body having upper/lower cladding layers sandwich an active layer having a quantum well structure, and AlGaAs low refractive index layers are respectively provided between the upper/lower cladding layers and upper/lower guide layers provided between the cladding layers and the active layer, and which have a refractive index lower than each of the upper/lower cladding layers, are made asymmetrical in Al composition and thickness (refer to Japanese Patent Laid-open No. 8-195529 (FIGS. 9 and 10), for example).

Further, an example has been disclosed wherein a semiconductor laser element having a configuration in which an n-(Al0.7Ga0.3)0.5In0.5P lower cladding layer and a p-(Al0.7Ga0.3)0.5In0.5P first upper cladding layer are disposed up and down with a multi-quantum well active layer interposed in between, and a p-(Al0.7Ga0.3)0.5In0.5P second upper cladding layer is disposed on the first upper cladding layer interposing a protective layer of p-Ga0.5In0.5P in between, has an active layer disordered region in which a quantum well active layer is disordered, at an end face of a resonator and in the neighborhood thereof (refer to Japanese Patent Laid-open No. 2001-15864 (twelfth column and FIG. 4), for example).

A conventional semiconductor laser device is a semiconductor laser wherein n- and p-cladding layers sandwich an active layer having a quantum well structure are asymmetrical in refractive index distribution. It is known that when a window region in which the active layer is disordered is not provided, light intensity distribution at an outgoing end face of the semiconductor laser, i.e., a near-field image or pattern (NFP) is asymmetrical with respect to the active layer. The far-field pattern is expressed as a Fourier transform of the near-field pattern, so that the far-field pattern is symmetrical in both the direction normal to the active layer and the direction parallel to it. The center of the light intensity distribution is also placed on the normal extending from a light-emitting point of the laser outgoing end face.

However, in a semiconductor laser in which the cladding layers on the n and p sides are asymmetrical in refractive index distribution, is accompanied by a problem in that when a window region, in which the active layer is disordered, is provided, the center of the far-field pattern as viewed in the vertical direction is inclined about 0.5 to 3° toward the n-cladding layer side, and it is difficult to couple an external apparatus with the laser light.

SUMMARY OF THE INVENTION

The present invention has been devised to solve the above problems. It is, therefore, a primary object of the present invention to provide a semiconductor laser device which makes refractive index distributions of n- and p-cladding layers asymmetric with each other and includes a window structure with a disordered MQW active layer, wherein the inclination of the center of a far-field pattern extending in the direction normal to the corresponding active layer is small.

According to one aspect of the invention, there is provided a semiconductor laser device comprising: a semiconductor substrate of first conductivity type; a first cladding layer of first conductivity type disposed on the semiconductor substrate; an active layer disposed on the first cladding layer and having a quantum well structure and a window structure disordered in the neighborhood of an outgoing end face thereof; and a second cladding layer of second conductivity type disposed on the active layer; wherein when the first conductivity type or the second conductivity type is set as an n type, a refractive index of a first portion of a p-type cladding layer adjacent to the active layer is set to a value smaller than a refractive index of an n-type cladding layer, and a refractive index of the remaining second portion of the p-type cladding layer is set to a value over the value of the refractive index of the first portion and close to the value of the refractive index of the n-type cladding layer.

Therefore, it is possible to cause a peak position of a light intensity at the window structure of the active layer to coincide with or extremely approach the position of the active layer.

Accordingly, It is also possible to suppress the inclination of the traveling direction of light at a window layer in which an MQW active layer is disordered, toward the n-cladding layer side and suppress the inclination of a light center of a far-field image toward the n-cladding layer side as extremely small as possible, while slope efficiency can be enhanced and a kink level and a temperature characteristic or the like can be enhanced with the setting of refractive index distributions of the n- and p-cladding layers to asymmetry.

Then, a semiconductor laser device can be provided which is high in efficiency, good in laser characteristic and high in reliability and which is easy to perform the coupling of laser light to an external apparatus.

According to another aspect of the invention, there is provided a semiconductor laser device comprising: a semiconductor substrate of first conductivity type; a first cladding layer of first conductivity type disposed on the semiconductor substrate; an active layer disposed on the first cladding layer and having a quantum well structure and a window structure disordered in the neighborhood of an outgoing end face thereof; and a second cladding layer of second conductivity type disposed on the active layer; wherein when the first conductivity type or the second conductivity type is set as an n type, a refractive index of a first portion of an n-type cladding layer adjacent to said active layer is set to a value larger than a refractive index of a p-type cladding layer, and a refractive index of the remaining second portion of the n-type cladding layer is set to a value less than the value of the refractive index of the first portion and close to the value of the refractive index of the p-type cladding layer.

Therefore, it is possible to cause a peak position of a light intensity at the window structure of the active layer to coincide with or extremely approach the position of the active layer.

Accordingly, It is also possible to suppress the inclination of the traveling direction of light at a window layer in which an MQW active layer is disordered, toward the n-cladding layer side and suppress the inclination of a light center of a far-field image toward the n-cladding layer side as extremely small as possible, while slope efficiency can be enhanced and a kink level and a temperature characteristic or the like can be enhanced with the setting of refractive index distributions of the n- and p-cladding layers to asymmetry.

Then, a semiconductor laser device can be provided which is high in efficiency, good in laser characteristic and high in reliability and which is easy to perform the coupling of laser light to an external apparatus.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

In the description of the following embodiments, ridge type semiconductor lasers each having an oscillation wavelength of 670 nm, which make use of AlGaInP, will be explained by way of example.

First Embodiment

Figure 1:
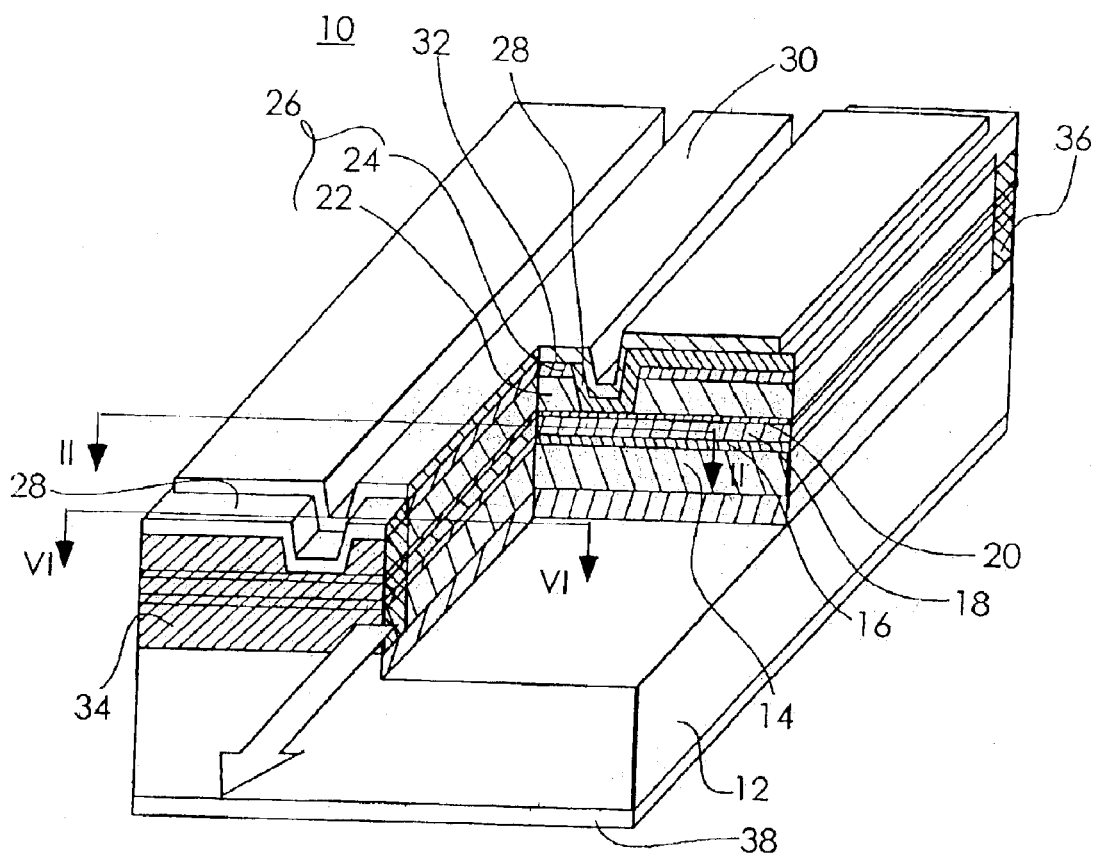
FIG. 1 is a partly broken perspective view of a semiconductor laser according to one embodiment of the present invention.
Figure 2:
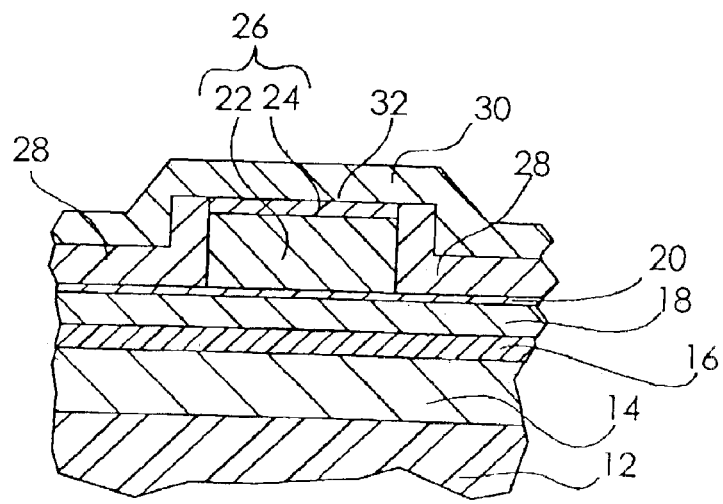
FIG. 2 is a cross-sectional view of the neighborhood of a ridge portion as viewed in a cross-section taken along line II—II of FIG. 1

FIG. 1 is a partly broken perspective view of a semiconductor laser according to one embodiment of the present invention. FIG. 2 is a cross-sectional view of the neighborhood of a ridge portion as viewed in a cross-section taken along line II—II of FIG. 1 illustrative of the semiconductor laser according to the one embodiment of the present invention.

In FIGS. 1 and 2, the semiconductor laser 10 is a red ridge type semiconductor laser suitable for an optical disc system and optical communications. A lower cladding layer 14 used as a first cladding layer is disposed on an Si-doped n-GaAs substrate 12 used as a semiconductor substrate. The thickness of the lower cladding layer 14 ranges from 1.5 μm to 4 mμ, its material is denoted or expressed in n-(Al$_x$Ga$_{1-x}$)$_{0.5}$In$_{0.5}$P, and a composition ratio x thereof ranges from about 0.5 to about 0.75. In the first embodiment, x=0.66, for example. A carrier concentration of the lower cladding layer 16 ranges from about $0.3 \times 10^{18}$ to about $0.8 \times 10^{18}$ cm$^{-3}$.

An active layer 16 having a multi-quantum well structure (hereinafter called "MQW structure") is disposed on the lower cladding layer 14. The MQW structure of the active layer 16 is configured as follows: Well layers 16b of GaInP (not shown) are provided with a barrier layer 16a of AlGaInP (not shown) interposed between well layers 16b, and guide layers 16c of AlGaInP (not shown), which interpose the well layers 16b at both ends of the active layer 16, which are provided at outermost layers, from both sides, are disposed. In the following description, the active layer 16 is made up of the barrier layer 16a, the well layers 16b and the guide layers 16c.

The thickness of the barrier layer 16a ranges from 2 to 10 nm, the material thereof is represented by (Al$_x$Ga$_{1-x}$)$_{0.5}$In$_{0.5}$P, and its composition ratio x ranges from about 0.2 to about 0.75. In the case of the first embodiment, the composition ratio x is 0.5, for example. The barrier layer 16a is undoped. The guide layers 16c are also made of the same material as the barrier layer 16a.

The thickness of each well layer 16b ranges from 2 to 10 nm, the material thereof is Ga$_{1-x}$In$_x$P, and its composition ratio x is adjusted such that an oscillating wavelength reaches a desired value, e.g., 670 nm. The well layers 16b are undoped.

A first upper cladding layer 18 corresponding to part of a second cladding layer adjacent to the active layer 16 is disposed on the active layer 16. The thickness of the first upper cladding layer 18 ranges from 0.1 to 1 μm, the material thereof is expressed in p-(Al$_x$Ga$_{1-x}$)$_{0.5}$In$_{0.5}$P, and a composition ratio x thereof ranges from about 0.5 to about 0.75. In the case of the first embodiment, the composition ratio x is 0.7, for example. A carrier concentration of the first upper cladding layer 18 ranges from $0.3 \times 10^{18}$ to $1.0 \times 10^{18}$ cm$^{-3}$.

An etching stopper layer 20 used when a ridge is formed is disposed on the first upper cladding layer 18. The material for the etching stopper layer 20 is expressed in p-(Al$_x$Ga$_{1-x}$)$_{0.5}$In$_{0.5}$P, and a composition ratio x thereof is 0.5, for example, in the first embodiment.

A second upper cladding layer 22 corresponding to another part of the second cladding layer is disposed on the etching stopper layer 20. The thickness of the second upper cladding layer 22 ranges from 0.5 to 2 μm, the material thereof is represented by p-(Al$_x$Ga$_{1-x}$)$_{0.5}$In$_{0.5}$P, and a composition ratio x thereof ranges from 0.5 to 0.75. In the first embodiment, x=0.66. A carrier concentration of the second upper cladding layer 22 ranges from about $0.3 \times 10^{18}$ to about $1.0 \times 10^{18}$ cm$^{-3}$.

A contact layer 24 of p-GaAs is disposed on the second upper cladding layer 22. The second upper cladding layer 22 and the contact layer 24 form a strip mesa-shaped ridge 26. The side faces of the ridge 26, and the surface of the etching stopper layer 20, which is exposed upon formation of the ridge 26, are covered with an insulating film 28 such as a nitride film.

A surface electrode 30 on a p side is disposed on the surface of the contact layer 24 and the surface of the insulating film 28. The surface electrode 30 is connected to the contact layer 20 through an opening 32 defined in the insulating film 28, which forms a current path to the active layer 16 through the ridge 26.

Window regions 34 and 36 are disposed in the neighborhood of chip's both end faces which serve as both end faces of a resonator of the semiconductor laser 10. The window regions 34 and 36 are regions in which an impurity element is introduced into the neighborhood of the chip's both end faces and each include the active layer 16 used as a window structure, in which the MQW structure of the active layer 16 is disordered, the first upper cladding layer 18, the second upper cladding layer 22 and the lower cladding layer 14. Although the window regions are shown with being shaded in FIG. 1, the diagonally-shaped areas do not indicate their cross-sections but show diffusion regions of the impurity element.

The contact layer 24 is removed from the surfaces of the tops of the window regions 34 and 36, and the insulating film 28 is disposed on each window region. A back electrode 38 on an n side is disposed on the back side of the n-GaAs substrate 12.

In FIG. 1, an outline arrow indicates laser light emitted from the semiconductor laser 10.

Figure 3:
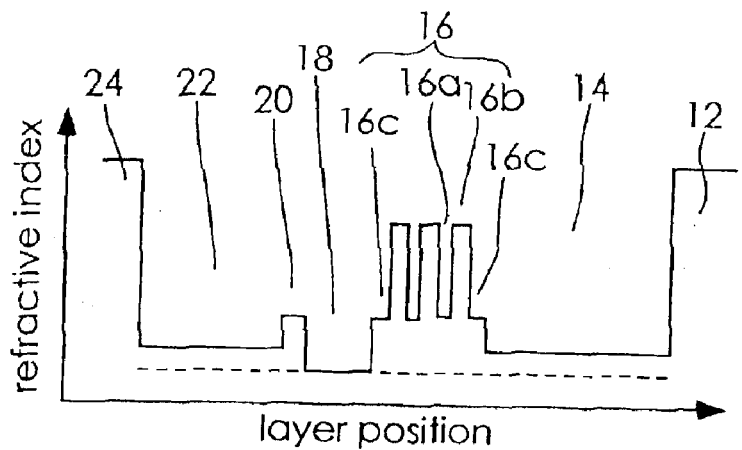
FIG. 3 is a typical diagram showing a refractive index distribution of the semiconductor laser according to one embodiment of the present invention.

FIG. 3 is a typical diagram showing a refractive index distribution of the semiconductor laser according to the first embodiment.

In the first embodiment, the refractive index of the first upper cladding layer 18 is set to a value smaller than that of the lower cladding layer 14. Further, the refractive index of the second upper cladding layer 22 is set to a value identical to that of the lower cladding layer 14. However, they may not be necessarily identical. If the refractive index of the second upper cladding layer 22 is larger than that of the first upper cladding layer 18 adjacent to the active layer 16 and is close to that of the lower cladding layer 14, then the refractive index of the second upper cladding layer 22 may be slightly higher or lower than that of the lower cladding layer 14.

The difference in refractive index allowable between the second upper cladding layer 22 and the lower cladding layer 14 is considered to be enough if close to within, for example, ±about 30% of the difference in composition ratio x where the materials for the second upper cladding layer 22 and the lower cladding layer 14 are each represented by (Al$_x$Ga$_{1-x}$)$_{0.5}$In$_{0.5}$P and the difference in refractive index is considered in the composition ratio.

An outline of a method of manufacturing the semiconductor laser 10 will next be described.

An n-(Al$_{0.66}$Ga$_{0.34}$)$_{0.5}$In$_{0.5}$P layer used as a lower cladding layer 14, an active layer 16 having an MQW structure, a p-(Al$_{0.7}$Ga$_{0.3}$)$_{0.5}$In$_{0.5}$P layer used as a first upper cladding layer 18, a p-(Al$_{0.5}$Ga$_{0.5}$)$_{0.5}$In$_{0.5}$P layer used as an etching stopper layer 20, a p-(Al$_{0.66}$Ga$_{0.34}$)$_{0.5}$In$_{0.5}$P layer used as a second upper cladding layer 22, and a p-GaAs layer used as a contact layer 24 are sequentially formed on an n-GaAs substrate 12 by a crystal growth method such as MOCVD or the like.

Next, window regions 34 and 36 each including a window structure in which the active layer 16 having the MQW structure is disordered, are formed by Zn diffusion or the like.

Next, a resist film or an insulating film is formed on the contact layer 24. A mask pattern for covering the contact layer 24 in the form of a stripe extended in an optical waveguiding direction is formed. With the mask pattern as a mask, it is selectively etched using a sulfuric acid or hydrochloric acid etching solution to thereby form a stripe mesa-shaped ridge 26 formed of the contact layer 24 and the second upper cladding layer 22. Using a suitable etching solution such as sulfuric acid or the like in this etching makes it possible to automatically stop the etching with the etching stopper layer 20.

Next, an insulating film such as a nitride film is formed over the whole surface. An opening 32 is made in the top of the ridge 26 by photolithography. A gold film is formed on the ridge 26 through the insulating film 28 having the opening 32 to thereby form a surface electrode 30 on a p side. Thereafter, the back of the n-GaAs substrate 12 is further ground to a desired thickness, and a back electrode 38 is formed on the back of the n-GaAs substrate 12, whereby a corresponding device is completed.

The operation of the semiconductor laser 10 will next be described.

Figure 4:
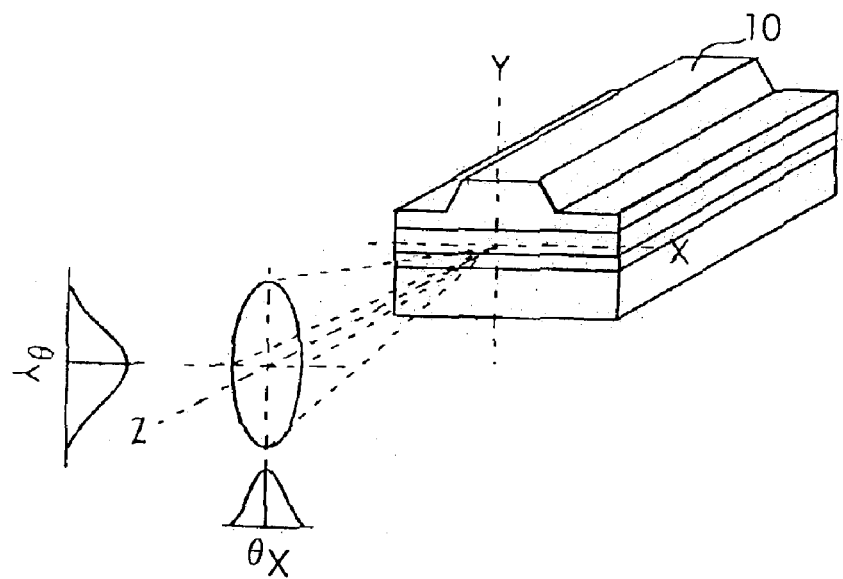
FIG. 4 is a typical diagram for describing a far-field image or pattern of the semiconductor laser according to the present invention.

FIG. 4 is a typical diagram for describing a far-field image or pattern of the semiconductor laser according to the present invention.

In FIG. 4, the origin point of a coordinate axis is placed in a light-emitting point of an outgoing end face of the semiconductor laser. An X axis extends in a direction parallel to an active layer at the outgoing end face, a Y axis extends in a direction orthogonal to the active layer at the outgoing end face, and a Z axis indicates the normal to the outgoing end face.

An intensity distribution of laser light emitted from the semiconductor laser 10 is an ellipsoid long in the direction orthogonal to the active layer, which is called a far-field image or far-field pattern (FFP) or the like. The expansion of a far-field image in a Y direction corresponding to the direction orthogonal to the active layer is large, and a light intensity distribution thereof is θy. The expansion of a far-field image in an X direction corresponding to the direction parallel to the active layer is small and a light intensity distribution thereof is θX.

Since the laser light is normally emitted in the direction normal to the laser outgoing end face, the center of the far-field image is placed on the Z axis extending in the direction of the normal extended from the light-emitting point of the laser outgoing end face. This normal is an important line used as the reference for coupling an external apparatus and laser light emitted from a laser light source.

Even in the case of a semiconductor laser wherein refractive index distributions of n- and p-cladding layers disposed with an active layer having a quantum well structure interposed therebetween are asymmetric with each other, a light intensity distribution of a near field pattern (NFP) is asymmetric with respect to the active layer where there is no window region in which the active layer is disordered. In the far-filed pattern, however, θY and θX each take a symmetric shape, and the center of a light intensity distribution thereof is also placed on the Z axis.

However, there may be a case in which when the window region in which the active layer is disordered, is provided, this situation changes and thereby the center of the far-field pattern in the Y direction is inclined about 0.5 to 3° toward the n-cladding layer side.

Therefore, the semiconductor laser 10 according to the present invention makes use of the n-(Al0.66Ga0.34)0.5In0.5P layer as the lower cladding layer 14, and uses the p-(Al0.7Ga0.3)0.5In0.5P layer as the first upper cladding layer 18 disposed adjacent to the active layer 16 having the quantum well structure. Thus, the refractive index distributions of the n- and p-cladding layers disposed with the active layer 16 interposed therebetween are brought into such an asymmetry that the refractive index of the n-cladding layer becomes larger than that of the p-cladding layer. Further, the p-(Al0.66Ga0.34)0.5In0.5P layer as the second upper clad layer 22 is disposed on the active layer 16 with the first upper cladding layer 18 interposed in between.

As is understood even from the refractive index distribution of FIG. 3, the refractive index of the first upper cladding layer 18 is set higher as compared with the case in which the first upper cladding layer 18 and the second upper cladding layer 22 have conventionally been set to the same refractive index, so that the weighted center of a refractive index distribution in the inside of the semiconductor laser approaches the active layer 16.

Figure 5:
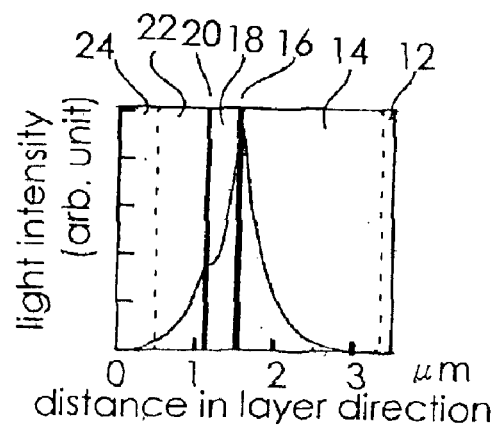
FIG. 5 is a graph showing a light intensity distribution in the inside of the semiconductor laser according to one embodiment of the present invention.

FIG. 5 is a graph showing a light intensity distribution in the inside of the semiconductor laser according to the first embodiment of the present invention.

FIG. 5 shows the result of calculation of a light intensity distribution lying in the direction orthogonal to the active layer at a sectional position including an active region of the active layer except the window region, e.g., a cross-section taken along line II—II of FIG. 1. The vertical axis indicates a light intensity expressed in an arbitrary unit, and the horizontal axis indicates the distance of each layer as viewed in its layer direction.

Figure 6:
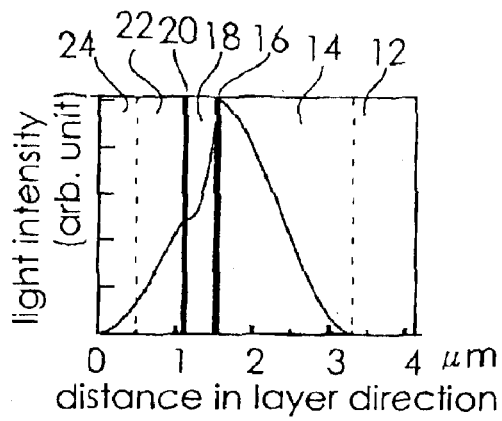
FIG. 6 is a graph showing a light intensity distribution in the inside of the semiconductor laser according to one embodiment of the present invention.

FIG. 6 is a graph showing a light intensity distribution in the inside of the semiconductor laser according to the first embodiment of the present invention.

FIG. 6 shows the result of calculation of a light intensity distribution lying in the direction orthogonal to the active layer at a sectional position of the window region including a disordered active layer, e.g., a cross-section taken along line VI—VI of FIG. 1. The vertical axis indicates a light intensity represented in an arbitrary unit, and the horizontal axis indicates the distance of each layer as viewed in its layer direction.

As shown in FIG. 5, a peak position of the light intensity distribution coincides with the active layer 16 at the sectional position including the active region of the active layer lying inside of the semiconductor laser. As shown in FIG. 6, the position of the peak of the light intensity distribution coincides with or approaches closely the active layer 16 even at the sectional position of the window region including the disordered active layer.

Therefore, light emitted from the window region 36 at the outgoing end face can be suppressed in such a manner that it propagates as close as to the direction (Z axis) of the normal to the outgoing end face, and the angle at which the center of a far-field image is inclined toward the n-cladding layer side, is extremely reduced.

Figure 7:
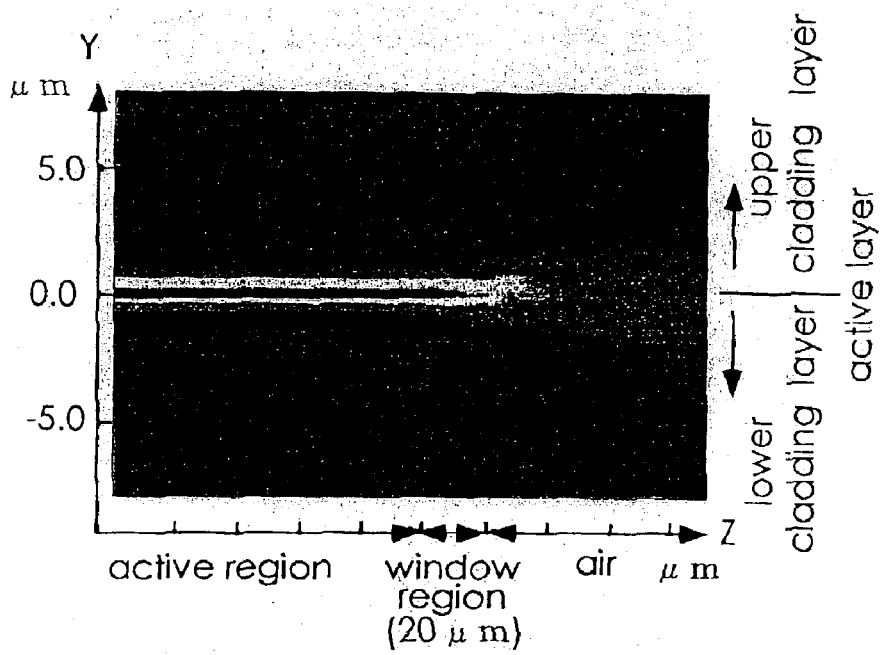
FIG. 7 is a light distribution diagram as viewed in an active layer direction in the semiconductor laser according to one embodiment of the present invention.

FIG. 7 is a light distribution diagram as viewed in an active layer direction in the semiconductor laser according to the first embodiment of the present invention.

As shown in FIG. 7, the travelling direction of light remains unchanged in the active region of the active layer lying inside of the semiconductor laser and the window region. Accordingly, the inclination of a light center in a far-field image toward the n-cladding layer side is considered to be extremely small.

Figure 8:
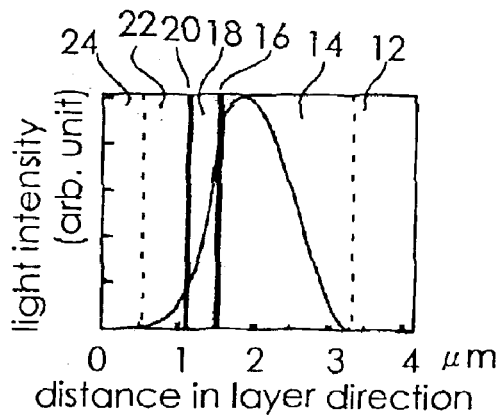
FIG. 8 is a graph showing a light intensity distribution in the inside of the semiconductor laser, which is calculated under conditions equivalent to those for the conventional structure.

FIG. 8 is a graph showing a light intensity distribution in the inside of the semiconductor laser, which is calculated under conditions equivalent to those for the conventional structure for comparison.

While the n-(Al0.66Ga0.34)0.5In0.5P layer is used as the lower cladding layer 14 and the p-(Al0.7Ga0.3)0.5In0.5P layer is used as the first upper cladding layer 18 disposed adjacent to the active layer 16 having the quantum well structure, thereby allowing the refractive index distributions of the n- and p-cladding layers interposing the active layer 16 in between to be made asymmetric in FIG. 8, the refractive index of the second upper cladding layer 22 disposed above the active layer 16 through the first upper cladding layer 18 is set to the same refractive index as the first upper cladding layer 18.

In this case, the peak position of the light intensity distribution coincides with the active layer at the sectional position including the active region of the active layer lying inside of the semiconductor laser. However, since an equivalent refractive index becomes smaller than the refractive index of the lower cladding layer 14 and an emission mode is reached as shown in FIG. 8 at the sectional position of the window region including the disordered active layer, a light intensity distribution given by a sin function appears on the side of the lower cladding layer 14, and its peak position is not coincident with the active layer 16 and is spaced away from the active layer.

Figure 9:
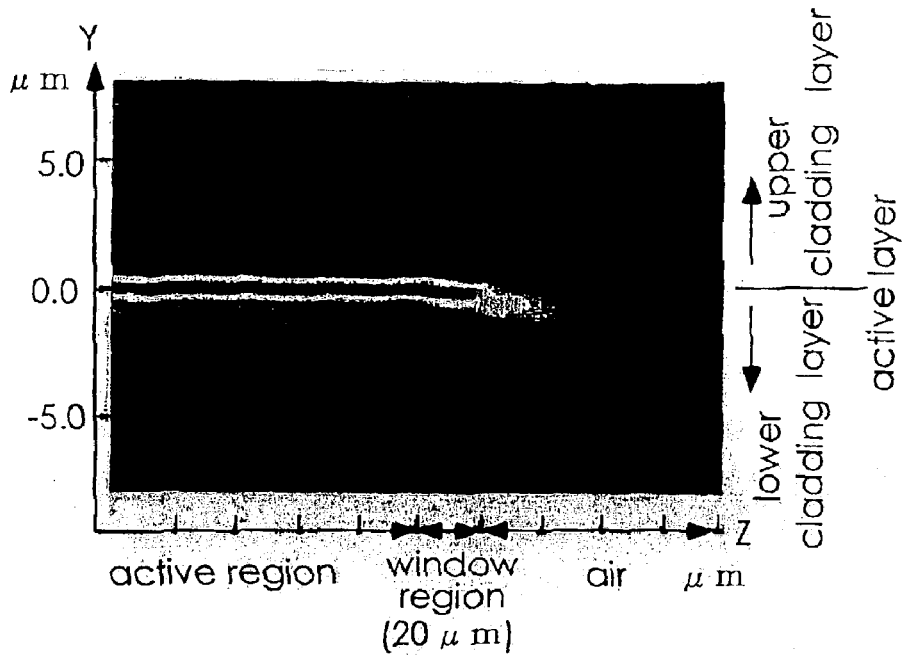
FIG. 9 is a diagram showing a light distribution of the semiconductor laser as viewed in an active layer direction, which is calculated under conditions equivalent to those for the conventional structure.

FIG. 9 is a diagram showing a light distribution of the semiconductor laser as viewed in an active layer direction, which is calculated under conditions equivalent to those for the conventional structure for comparison.

FIG. 9 is a light distribution diagram as viewed in the active layer direction under the same conditions as those in FIG. 8. The travelling direction of light changes in the window region and is inclined toward the n-cladding layer side. That is to say, an inclination toward the n-cladding layer side of a far-field image probably takes place.

Figure 10:
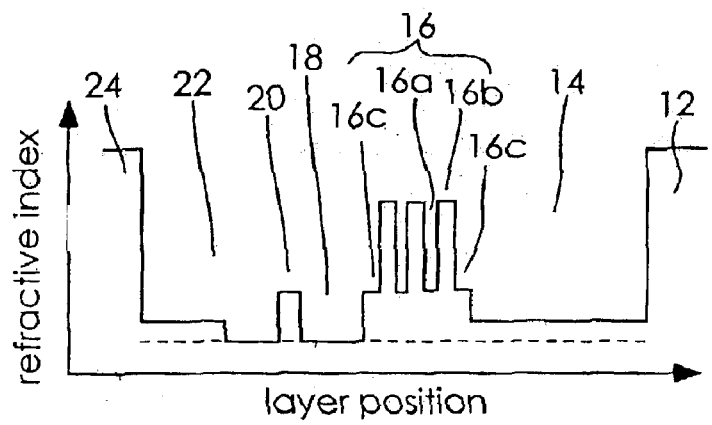
FIGS. 10 and 11 are typical diagrams showing refractive index distributions of a modification of the semiconductor laser according to one embodiment of the present invention.
Figure 11:
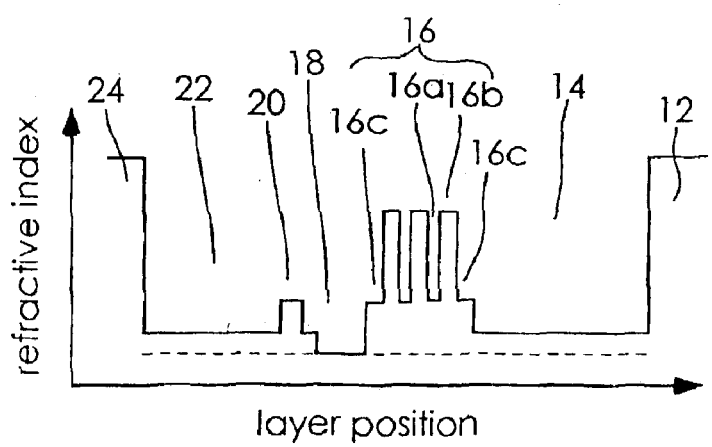

FIGS. 10 and 11 are typical diagrams showing refractive index distributions of a modification of the semiconductor laser according to the first embodiment.

In the configuration shown in FIG. 3, the refractive index of the first upper cladding layer 18 is smaller than that of the lower cladding layer 14, and the refractive index of the second upper cladding layer 22 formed as the ridge 26 is identical to or close to that of the lower cladding layer 14. However, such a configuration as shown in FIG. 10 is an example in which a region set to the same refractive index as the first upper cladding layer 18 is extended to within the ridge, whereas such a configuration as shown in FIG. 11 is an example in which a region having the refractive index of the second upper cladding layer 22 is extended to the side of the active layer 16 with respect to the etching stopper layer 20. Both bring about effects similar to the configuration shown in FIG. 3.

In the semiconductor laser device according to the first embodiment as described above, the refractive index of the p-first upper cladding layer adjacent to the active layer of the semiconductor laser is set to a value smaller than that of the n-lower cladding layer, and the refractive index of the p-second upper cladding layer disposed on the active layer with the p-first upper cladding layer interposed in between exceeds the value of the refractive index of the p-first upper cladding layer and is close to the value of the refractive index of the n-lower cladding layer. Owing to the setting of the refractive index distributions of the n- and p-cladding layers to the asymmetry, slope efficiency can be enhanced and a kink level and a temperature characteristic or the like can be improved. It is also possible to suppress the inclination of the travelling direction of the light toward the n-cladding layer at the window layer in which the MQW active layer is disordered, and suppress the inclination of the light center of the far-field image toward the n-cladding layer side as extremely small as possible. Then, a semiconductor laser device can be provided which is high in efficiency, good in laser characteristic and high in reliability and which is easy to execute the coupling of laser light to an external apparatus.

Second Embodiment

Figure 12:
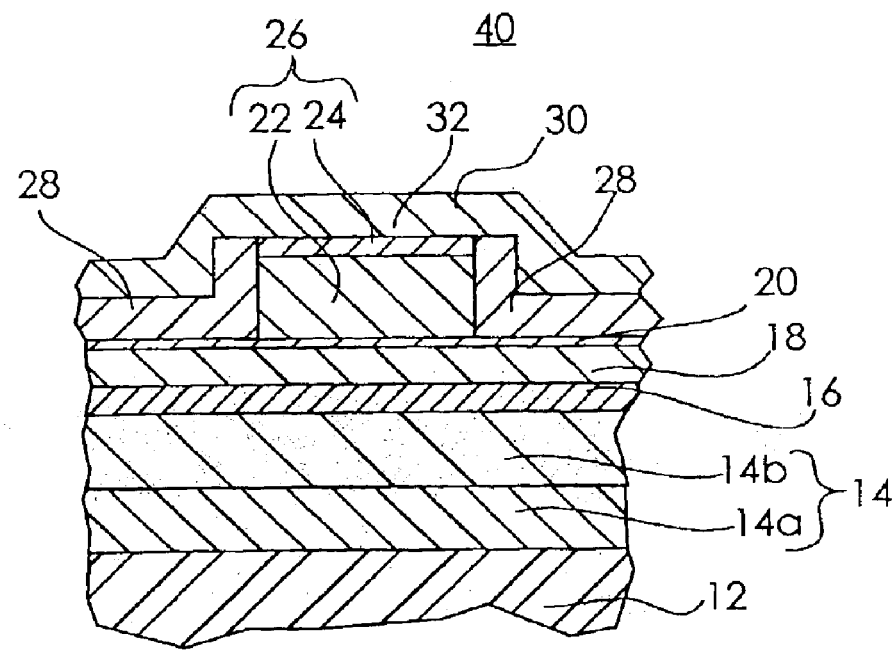
FIG. 12 is a cross-sectional view of the neighborhood of a ridge portion of a semiconductor laser according to one embodiment of the present invention.

FIG. 12 is a cross-sectional view of the neighborhood of a ridge portion of a semiconductor laser according to one embodiment of the present invention.

FIG. 12 is a cross-sectional view showing a section equivalent to a sectional position including an active region of an active layer except a window region, e.g., the section taken along line II—II of FIG. 1. The same reference numerals as those in FIGS. 1 and 2 indicate the same or equivalent parts.

The semiconductor laser 40 according to the second embodiment is roughly identical to the semiconductor laser 10 of FIG. 1 in basic configuration. However, a point of difference therebetween resides in that one layer of the n-(Al0.66Ga0.34)0.5In0.5P layer is disposed as the lower cladding layer 14 in the semiconductor laser 10, whereas in the semiconductor laser 40, a lower cladding layer 14 is made up of two layers, an n-(Al0.7Ga0.3)0.5In0.5P layer is disposed as the first lower cladding layer 14a near an n-GaAs substrate 12, and an n-(Al0.66Ga0.34)0.5In0.5P layer is disposed as the second lower cladding layer 14b adjacent to an active layer.

Another point of difference therebetween resides in that the p-(Al0.66Ga0.34)0.5In0.5P layer is disposed as the second upper cladding layer 22 in the semiconductor layer 10, whereas in the semiconductor laser 40, a p-(Al0.7Ga0.3) 0.5In0.5P layer is disposed as a second upper cladding layer 22, thereby setting a first upper cladding layer 18 and the second upper cladding layer 22 to the same refractive index.

Figure 13:
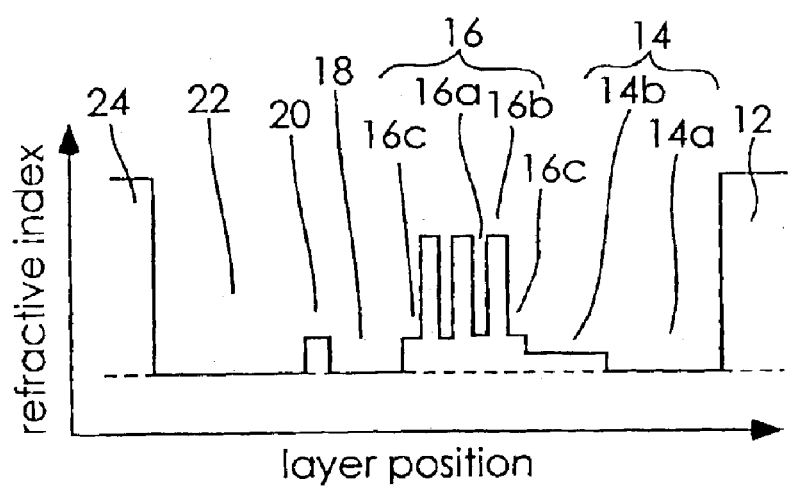
FIG. 13 is a typical diagram showing a refractive index distribution of the semiconductor laser according to one embodiment of the present invention.

FIG. 13 is a typical diagram showing a refractive index distribution of the semiconductor laser according to the second embodiment of the present invention.

In the second embodiment, the refractive indices of the first upper cladding layer 18 and the second upper cladding layer 22 are set to a value smaller than the refractive index of the second lower cladding layer 14b. Further, the refractive index of the first lower cladding layer 14a is set to the same value as that of the refractive index of each of the first upper cladding layer 18 and the second upper cladding layer 22.

However, the refractive index of the first lower cladding layer 14a may not necessarily be identical to that of the second lower cladding layer 14b. If the refractive index of the first lower cladding layer 14a is less than the value of the refractive index of the second lower cladding layer 14b and is close to the refractive indices of the first upper cladding layer 18 and the second upper cladding layer 22, then it may be slightly higher or lower than the refractive indices of the first upper cladding layer 18 and the second upper cladding layer 22.

The difference in refractive index allowable between the first lower cladding layer 14a and the first upper cladding layer 18, and between the first lower cladding layer 14a and the second upper cladding layer 22, is considered to be enough if close to within, for example, ±about 30% of the difference in composition ratio x where the materials for the first lower cladding layer 14a, the first upper cladding layer 18 and the second upper cladding layer 22 are each represented by (AlxGa1-x)0.5In0.5P and the difference in refractive index is considered in the composition ratio.

In the semiconductor laser 40 configured above, as is understood even from the refractive index distribution of FIG. 13, the refractive index of the first lower cladding layer 14a is set lower as compared with the case in which the first lower cladding layer 14a and the second lower cladding layer 14b have conventionally simply been made up of the n-(Al0.66Ga0.34)0.5In0.5P layer and set to the same refractive index, and the first upper cladding layer 18 and the second upper cladding layer 22 make use of the p-(Al0.7Ga0.3)0.5In0.5P layer, whereby the weighted center of a refractive index distribution in the inside of the semiconductor laser approaches the active layer 16.

Thus, a peak position of a light intensity distribution coincides with or approaches closely the active layer 16 even at a sectional position of a window region including a disordered active layer. Therefore, light emitted from the window region 36 at its outgoing end face can be suppressed in such a manner that it propagates as close as to the direction (Z axis) of the normal to the outgoing end face, and the angle at which the center of a far-field image is inclined toward the n-cladding layer side, becomes extremely small.

In the semiconductor laser device according to the second embodiment as described above, the refractive index of the n-second lower cladding layer adjacent to the active layer of the semiconductor laser is set to a value larger than the refractive indices of the p-first and second cladding layers, and the refractive index of the n-first lower cladding layer separated from the active layer as compared with the n-second lower cladding layer is set to a value less than that of the refractive index of the n-second lower cladding layer and is set close to the value of the refractive index of each of the p-first and second upper cladding layers. Thus, owing to the setting of the refractive index distributions of the n- and p-cladding layers to asymmetry, slope efficiency can be enhanced and a kink level and a temperature characteristic or the like can be improved. It is also possible to suppress the inclination of the travelling direction of the light toward the n-cladding layer side at the window layer in which the MQW active layer is disordered, and suppress the inclination of the light center of the far-field image toward the n-cladding layer side as extremely small as possible.

Then, a semiconductor laser device can be provided which is high in efficiency, good in laser characteristic and high in reliability and which easy to perform the coupling of laser light to an external apparatus.

Incidentally, although the above embodiment has described the example using the n-type semiconductor substrate, similar effects can be brought about even in such a configuration that a p-type semiconductor substrate is used and a p-cladding layer, an active layer and an n-cladding layer are sequentially laminated on the p-type semiconductor substrate.

Although the aforementioned embodiment has also described the example of the red laser using AlGaInP, similar effects are brought about even in the case of a laser using AlGaAs, InGaAs and InP materials.

Further, although the above embodiment has described the ridge type semiconductor laser, even another type of semiconductor laser brings about similar effects.

Since the semiconductor laser device according to the present invention has such a configuration as described above, it has the following advantageous effects.

A semiconductor laser device according to the present invention comprises: a semiconductor substrate of first conductivity type; a first cladding layer of first conductivity type disposed on the semiconductor substrate; an active layer disposed on the first cladding layer and having a quantum well structure and a window structure disordered in the neighborhood of an outgoing end face thereof; and a second cladding layer of second conductivity type disposed on the active layer; wherein when the first conductivity type or the second conductivity type is set as an n type, a refractive index of a first portion of a p-type cladding layer adjacent to the active layer is set to a value smaller than a refractive index of an n-type cladding layer, and a refractive index of the remaining second portion of the p-type cladding layer is set to a value over the value of the refractive index of the first portion and close to the value of the refractive index of the n-type cladding layer. It is thus possible to cause a peak position of a light intensity at the window structure of the active layer to coincide with or extremely approach the position of the active layer.

Therefore, It is also possible to suppress the inclination of the traveling direction of light at a window layer in which an MQW active layer is disordered, toward the n-cladding layer side and suppress the inclination of a light center of a far-field image toward the n-cladding layer side as extremely small as possible, while slope efficiency can be enhanced and a kink level and a temperature characteristic or the like can be enhanced with the setting of refractive index distributions of the n- and p-cladding layers to asymmetry.

Then, a semiconductor laser device can be provided which is high in efficiency, good in laser characteristic and high in reliability and which is easy to perform the coupling of laser light to an external apparatus.

A semiconductor laser device according to the present invention comprises; a semiconductor substrate of first conductivity type; a first cladding layer of first conductivity type disposed on the semiconductor substrate; an active layer disposed on the first cladding layer and having a quantum well structure and a window structure disordered in the neighborhood of an outgoing end face thereof; and a second cladding layer of second conductivity type disposed on the active layer; wherein when the first conductivity type or the second conductivity type is set as an n type, a refractive index of a first portion of an n-type cladding layer adjacent to said active layer is set to a value larger than a refractive index of a p-type cladding layer, and a refractive index of the remaining second portion of the n-type cladding layer is set to a value less than the value of the refractive index of the first portion and close to the value of the refractive index of the p-type cladding layer. It is thus possible to cause a peak position of a light intensity at the window structure of the active layer to coincide with or extremely approach the position of the active layer.

Therefore, It is also possible to suppress the inclination of the traveling direction of light at a window layer in which an MQW active layer is disordered, toward the n-cladding layer side and suppress the inclination of a light center of a far-field image toward the n-cladding layer side as extremely small as possible, while slope efficiency can be enhanced and a kink level and a temperature characteristic or the like can be enhanced with the setting of refractive index distributions of the n- and p-cladding layers to asymmetry.

Then, a semiconductor laser device can be provided which is high in efficiency, good in laser characteristic and high in reliability and which is easy to perform the coupling of laser light to an external apparatus.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. A semiconductor laser device comprising:
   a semiconductor substrate of a first conductivity type;
   a first cladding layer of the first conductivity type, disposed on said semiconductor substrate;
   an active layer disposed on said first cladding layer and having a quantum well structure and a window structure disordered proximate an outgoing end face of the semiconductor laser device; and a second cladding layer of a second conductivity type, disposed on said active layer, wherein, when the first conductivity type or the second conductivity type is n type, refractive index of a first portion of a p-type cladding layer adjacent to said active layer is smaller than refractive index of an n-type cladding layer, and refractive index of a second portion of the p-type cladding layer is larger than the refractive index of the first portion and close to the refractive index of the n-type cladding layer.

2. A semiconductor laser device comprising:

a semiconductor substrate of a first conductivity type;

a first cladding layer of the first conductivity type, disposed on said semiconductor substrate;

an active layer disposed on said first cladding layer and having a quantum well structure and a window structure disordered proximate an outgoing end face of the semiconductor laser device; and a second cladding layer of a second conductivity type, disposed on said active layer, wherein when the first conductivity type or the second conductivity type is n type, refractive index of a first portion of an n-type cladding layer adjacent to said active layer is larger than refractive index of a p-type cladding layer, and refractive index of a second portion of the n-type cladding layer is smaller than the refractive index of the first portion and close to the refractive index of the p-type cladding layer.

* * * * *